US011116104B2

(12) United States Patent
Shen et al.

(10) Patent No.: US 11,116,104 B2
(45) Date of Patent: Sep. 7, 2021

(54) SERVER CHASSIS

(71) Applicant: CHENBRO MICOM CO., LTD., New Taipei (TW)

(72) Inventors: Kuang-Yun Shen, New Taipei (TW); Cheng-Feng Yang, New Taipei (TW); Chih-Wei Hou, New Taipei (TW)

(73) Assignee: CHENBRO MICOM CO., LTD., New Taipei (TW)

( * ) Notice: Subject to any disclaimer, the term of this patent is extended or adjusted under 35 U.S.C. 154(b) by 0 days.

(21) Appl. No.: 16/702,485

(22) Filed: Dec. 3, 2019

(65) Prior Publication Data

US 2020/0187378 A1    Jun. 11, 2020

(30) Foreign Application Priority Data

Dec. 7, 2018   (TW) .................................. 107216724

(51) Int. Cl.
*H05K 7/14*   (2006.01)
*A47B 96/02*   (2006.01)

(52) U.S. Cl.
CPC ......... *H05K 7/1489* (2013.01); *A47B 96/021* (2013.01)

(58) Field of Classification Search
CPC ............................. H05K 7/1489; A47B 96/021
See application file for complete search history.

(56) References Cited

U.S. PATENT DOCUMENTS 10,869,404 B2 * 12/2020 Yu ........................ H05K 7/1489

FOREIGN PATENT DOCUMENTS

| TW | M257604 U | 2/2005 |
| TW | M268627 U | 6/2005 |
| TW | 201102280 A1 | 1/2011 |
| TW | M425144 U1 | 3/2012 |
| TW | 201419983 A | 5/2014 |
| TW | I456377 B | 10/2014 |
| TW | I531295 B | 4/2016 |
| TW | M527413 U | 8/2016 |

\* cited by examiner

*Primary Examiner* — Kimberley S Wright
(74) *Attorney, Agent, or Firm* — CKC & Partners Co., LLC

(57) ABSTRACT

A server chassis includes a housing and two support portions. A bottom plate of the housing includes a loading surface and a three-dimensional reinforcing pattern integrally formed on the loading surface for reinforcing the structural strength of the bottom plate. The support portions are respectively located on an outer surface of the sidewall of the housing. A coverage area of the three-dimensional reinforcing pattern is greater than 10% of the total area of the loading surface. The three-dimensional reinforcing pattern includes a plurality of texture patterns regularly reproduced on the loading surface toward a linear axial direction. A maximum height of each of the texture patterns is 0.5-0.8 mm.

21 Claims, 10 Drawing Sheets

SERVER CHASSIS

CROSS-REFERENCE TO RELATED APPLICATION

This application claims priority to Taiwan Application Serial Number 107216724, filed Dec. 7, 2018, which is herein incorporated by reference.

BACKGROUND

Field of Disclosure

The present disclosure relates to a server chassis, and in particular to a server chassis with a three-dimensional reinforcing pattern.

Description of Related Art

With the growth in cloud demand, enterprises urgently need to add a large number of server devices. In the high-density use of the server devices, multiple servers are stacked in each cabinet. Generally, each server is loaded with at least one mainboard module, one memory module, one cooling fan, a plurality of hard disk assemblies arranged in a row or a column, or other electronic components such as a function adapter card. In addition, each server is also provided with electronic components in the server according to the cloud demands, so as to challenge the loading limit of the server.

However, since the server is erected on the cabinet through both sides of a tray, an area between both sides of the tray that is not supported is suspended in the cabinet. Thus, when the tray of the server bears the foregoing load, it may easily cause a flat surface of the tray to be easily subjected to downward recession or bending deformation. Therefore, not only the load capacity of the tray is reduced, causing components of a lower server to be damaged, but also the smoothness of staff pulling the server is affected.

Therefore, how to develop a solution to improve the foregoing deficiencies and inconvenience is an important issue that relevant persons engaged in the industry are currently unable to delay.

SUMMARY

One aspect of the disclosure is to provide a server chassis so as to solve the efficiencies mentioned in the prior art.

According to an embodiment of the disclosure, the server chassis includes a housing and two support portions. The housing includes a bottom plate and two side walls. The bottom plate has a loading surface and a three-dimensional reinforcing pattern. The three-dimensional reinforcing pattern is processed by a pattern die to be integrally formed on the loading surface for reinforcing the structural strength of the bottom plate. The side walls are respectively connected to two opposite sides of the loading surface and extend together in a same direction. There is a bending mark between each of the side walls and the loading surface. The bottom plate and the side walls together define an accommodating space. The support portions are respectively located on one surface of each of the side walls opposite to the accommodating space and configured to be erected on a rack. A coverage area of the three-dimensional reinforcing pattern is greater than 10% of the total area of the loading surface. The three-dimensional reinforcing pattern is formed by arranging a plurality of chain-type serial texture groups side by side. Each of the serial texture groups includes a plurality of spaced-apart texture patterns. The texture patterns are regularly reproduced on the loading surface toward a linear axial direction. A maximum height of each of the texture patterns is 0.5-0.8 mm.

According to one or more embodiments of the present disclosure, in the server chassis described above, the three-dimensional reinforcing pattern is an embossed pattern on the loading surface, and a surface of the bottom plate facing away from the loading surface has a concave pattern.

According to one or more embodiments of the present disclosure, the foregoing server chassis further includes at least one reinforcing convex hull. The reinforcing convex hull is formed on the loading surface in a protruding mode. The reinforcing convex hull is located in the coverage area of the embossed pattern, and the embossed pattern is located on a surface of the reinforcing convex hull.

According to one or more embodiments of the present disclosure, in the server chassis described above, portions of any two successively adjacent texture patterns of each of the serial texture groups are continuous side by side.

According to one or more embodiments of the present disclosure, in the server chassis described above, the linear axial direction passes through the bending marks.

According to one or more embodiments of the present disclosure, in the server chassis described above, the linear axial direction passing through the bending marks is parallel to a side edge of the loading surface.

According to one or more embodiments of the present disclosure, in the server chassis described above, each serial texture group includes a plurality of first arc portions and a plurality of second arc portions. The first arc portions are arranged at intervals along the linear axial direction to be a first series, and each of the first arc portions has a first recess. The second arc portions are arranged at intervals along the foregoing linear axial direction to be a second series parallel to the first series. The second arc portions of the second series are in staggered alignment with the first arc portions of the first series, and each of the second arc portions has a second recess. An end of each of any two successively adjacent second arc portions is located in one of the first recesses, and an end of each of any two successively adjacent first arc portions is located in one of the second recesses.

According to one or more embodiments of the present disclosure, in the server chassis described above, each serial texture group includes a plurality of bent portions and a plurality of oblique line groups. The bent portions are respectively wavy, and are jointly arranged into a single-column chain-type structure along the foregoing linear axial direction. Any two successively adjacent bent portions are staggered side by side. Each of the bent portions has a first concave arc portion and a second concave arc portion opposite to each other. In any two successively adjacent bent portions of the single-column chain-type structure, the first concave arc portion of one bent portion and the second concave arc portion of the other bent portion face each other and jointly define a common area. The oblique line groups are respectively located in one of the common areas. Each of the oblique line groups includes a plurality of side-by-side linear portions parallel to each other, and a long axis direction of each of the linear portions intersects with the foregoing linear axis direction.

According to one or more embodiments of the present disclosure, in the server chassis described above, the texture patterns of any two adjacent ones of the serial texture groups are in staggered alignment with each other, and each of the texture patterns includes a first square bracket body, a second square bracket body, and an oblique line group. The first square bracket body has a first protruding direction parallel to the linear axial direction. The second square bracket body has a second protruding direction parallel to the linear axial direction. The second protruding direction and the first protruding direction are opposite to each other. The oblique line group is located between the first square bracket body and the second square bracket body and includes a plurality of side-by-side linear portions parallel to each other, and a long axis direction of each of the linear portions intersects with the linear axis direction.

According to one or more embodiments of the present disclosure, in the server chassis described above, the texture patterns of each of the serial texture groups includes a plurality of first texture patterns and a plurality of second texture patterns. The first texture patterns and the second texture patterns are staggered with each other. The first texture patterns of any two adjacent ones of the serial texture groups are staggered side by side and the second texture patterns are staggered side by side. Each of the first texture patterns includes two first hook-shaped ribs and two second hook-shaped ribs. Each of the first hook-shaped ribs includes a first hook portion and a first straight line portion. One end of the first hook portion is directly connected to the first straight line portion, and the other end is a first free end. The first free ends of the first hook-shaped ribs face each other, the first straight line portions of the first hook-shaped ribs are parallel to each other side by side, and a length direction of each of the first straight line portions is parallel to the linear axial direction. Each of the second hook-shaped ribs includes a second hook portion and a second straight line portion. One end of the second hook portion is directly connected to the second straight line portion, and the other end is a second free end. The second free ends of the second hook-shaped ribs face each other, the second straight line portions of the second hook-shaped ribs are parallel to each other side by side, and a length direction of each of the second straight line portions is parallel to the linear axial direction. The first free end of each of the first hook-shaped ribs and the second free end of each of the second hook-shaped ribs are disposed opposite to each other, one of the first hook-shaped ribs is positioned between the two second straight line portions, and one of the second hook-shaped ribs is positioned between the two first straight line portions. Each of the second texture patterns includes a plurality of first straight ribs and three second straight ribs, the first straight ribs are parallel to each other side by side, and a length direction of each of the first straight ribs is parallel to the linear axial direction. The second straight ribs are located between the first straight ribs, a length of each of the second straight ribs is smaller than that of each of the first straight ribs, and a length direction of each of the second straight ribs is parallel to the linear axial direction.

According to one or more embodiments of the present disclosure, in the server chassis described above, the coverage area of the three-dimensional reinforcing pattern accounts for 90%-100% of the total area of the loading surface.

According to another embodiment of the disclosure, the server chassis includes a housing. The housing includes a bottom plate and two side walls. The bottom plate has a loading surface and a three-dimensional reinforcing pattern. The three-dimensional reinforcing pattern is processed by a pattern die to be integrally formed on the loading surface for reinforcing the structural strength of the bottom plate. The side walls are respectively connected to two opposite sides of the loading surface and extend together in a same direction. There is a bending mark between each of the side walls and the loading surface. The bottom plate and the side walls together define an accommodating space. The three-dimensional reinforcing pattern is formed by arranging a plurality of serial texture groups side by side. Each of the serial texture groups includes a plurality of spaced-apart texture patterns. The texture patterns are regularly reproduced on the loading surface toward a linear axial direction.

According to a further embodiment of the disclosure, the server chassis includes a housing and two support portions. The housing includes a bottom plate and two side walls. The side walls are respectively connected to two opposite sides of the loading surface and extend together in a same direction. The bottom plate has a loading surface and a three-dimensional reinforcing pattern. There is a bending mark between the loading surface and each of the side walls. The bottom plate and the side walls together define an accommodating space. The three-dimensional reinforcing pattern is processed by a pattern die to be integrally formed on the loading surface for reinforcing the structural strength of the bottom plate. The support portions are respectively located on one surface of each of the side walls opposite to the accommodating space and configured to be erected on a rack. The three-dimensional reinforcing pattern is formed by arranging a plurality of chain-type serial texture groups side by side, each of the serial texture groups includes a plurality of spaced-apart texture patterns, the texture patterns are regularly reproduced on the loading surface toward a linear axial direction, portions of any two successively adjacent texture patterns of each of the serial texture groups are continuous side by side, and a maximum height of each of the texture patterns is 0.5-0.8 mm.

According to one or more embodiments of the present disclosure, in the server chassis described above, the three-dimensional reinforcing pattern is an embossed pattern on the loading surface, and a surface of the bottom plate facing away from the loading surface has a concave pattern.

According to one or more embodiments of the present disclosure, the foregoing server chassis further includes at least one reinforcing convex hull. The reinforcing convex hull is formed on the loading surface in a protruding mode. The reinforcing convex hull is located in the coverage area of the embossed pattern, and the embossed pattern is located on a surface of the reinforcing convex hull.

According to one or more embodiments of the present disclosure, in the server chassis described above, the linear axial direction passes through the bending marks.

According to one or more embodiments of the present disclosure, in the server chassis described above, the linear axial direction passing through the bending marks is parallel to a side edge of the loading surface.

According to one or more embodiments of the present disclosure, in the server chassis described above, each serial texture group includes a plurality of first arc portions and a plurality of second arc portions. The first arc portions are arranged at intervals along the linear axial direction to be a first series, and each of the first arc portions has a first recess. The second arc portions are arranged at intervals along the foregoing linear axial direction to be a second series parallel to the first series. The second arc portions of the second series are in staggered alignment with the first arc portions of the first series, and each of the second arc portions has a second recess. An end of each of any two successively adjacent second arc portions is located in one of the first recesses, and an end of each of any two successively adjacent first arc portions is located in one of the second recesses.

According to one or more embodiments of the present disclosure, in the server chassis described above, each serial texture group includes a plurality of bent portions and a plurality of oblique line groups. The bent portions are respectively wavy, and are jointly arranged into a single-column chain-type structure along the foregoing linear axial direction. Any two successively adjacent bent portions are staggered side by side. Each of the bent portions has a first concave arc portion and a second concave arc portion opposite to each other. In any two successively adjacent bent portions of the single-column chain-type structure, the first concave arc portion of one bent portion and the second concave arc portion of the other bent portion face each other and jointly define a common area. The oblique line groups are respectively located in one of the common areas. Each of the oblique line groups includes a plurality of side-by-side linear portions parallel to each other, and a long axis direction of each of the linear portions intersects with the foregoing linear axis direction.

According to one or more embodiments of the present disclosure, in the server chassis described above, the texture patterns of any two adjacent ones of the serial texture groups are in staggered alignment with each other, and each of the texture patterns includes a first square bracket body, a second square bracket body, and an oblique line group. The first square bracket body has a first protruding direction parallel to the linear axial direction. The second square bracket body has a second protruding direction parallel to the linear axial direction. The second protruding direction and the first protruding direction are opposite to each other. The oblique line group is located between the first square bracket body and the second square bracket body and includes a plurality of side-by-side linear portions parallel to each other, and a long axis direction of each of the linear portions intersects with the linear axis direction.

According to one or more embodiments of the present disclosure, in the server chassis described above, the texture patterns of each of the serial texture groups includes a plurality of first texture patterns and a plurality of second texture patterns. The first texture patterns and the second texture patterns are staggered with each other. The first texture patterns of any two adjacent ones of the serial texture groups are staggered side by side and the second texture patterns are staggered side by side. Each of the first texture patterns includes two first hook-shaped ribs and two second hook-shaped ribs. Each of the first hook-shaped ribs includes a first hook portion and a first straight line portion. One end of the first hook portion is directly connected to the first straight line portion, and the other end is a first free end. The first free ends of the first hook-shaped ribs face each other, the first straight line portions of the first hook-shaped ribs are parallel to each other side by side, and a length direction of each of the first straight line portions is parallel to the linear axial direction. Each of the second hook-shaped ribs includes a second hook portion and a second straight line portion. One end of the second hook portion is directly connected to the second straight line portion, and the other end is a second free end. The second free ends of the second hook-shaped ribs face each other, the second straight line portions of the second hook-shaped ribs are parallel to each other side by side, and a length direction of each of the second straight line portions is parallel to the linear axial direction. The first free end of each of the first hook-shaped ribs and the second free end of each of the second hook-shaped ribs are disposed opposite to each other, one of the first hook-shaped ribs is positioned between the two second straight line portions, and one of the second hook-shaped ribs is positioned between the two first straight line portions. Each of the second texture patterns includes a plurality of first straight ribs and three second straight ribs, the first straight ribs are parallel to each other side by side, and a length direction of each of the first straight ribs is parallel to the linear axial direction. The second straight ribs are located between the first straight ribs, a length of each of the second straight ribs is smaller than that of each of the first straight ribs, and a length direction of each of the second straight ribs is parallel to the linear axial direction.

Therefore, through the structure described in each of the foregoing embodiments, the three-dimensional reinforcing pattern evenly distributed on the bottom plate can strengthen the structural strength of the bottom plate, so that the chassis bearing a considerable weight avoids or at least slows down a degree of downward recession or bending deformation. Therefore, not only the load capacity of the server chassis is reduced, but also the chance of damage to components of a lower server can be reduced, thus ensuring the smoothness of staff pulling the server.

The above description is merely used for illustrating the problems to be resolved, the technical methods for resolving the problems and their efficacies, etc. The specific details of the disclosure will be explained in the embodiments below and related drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Figure 1:
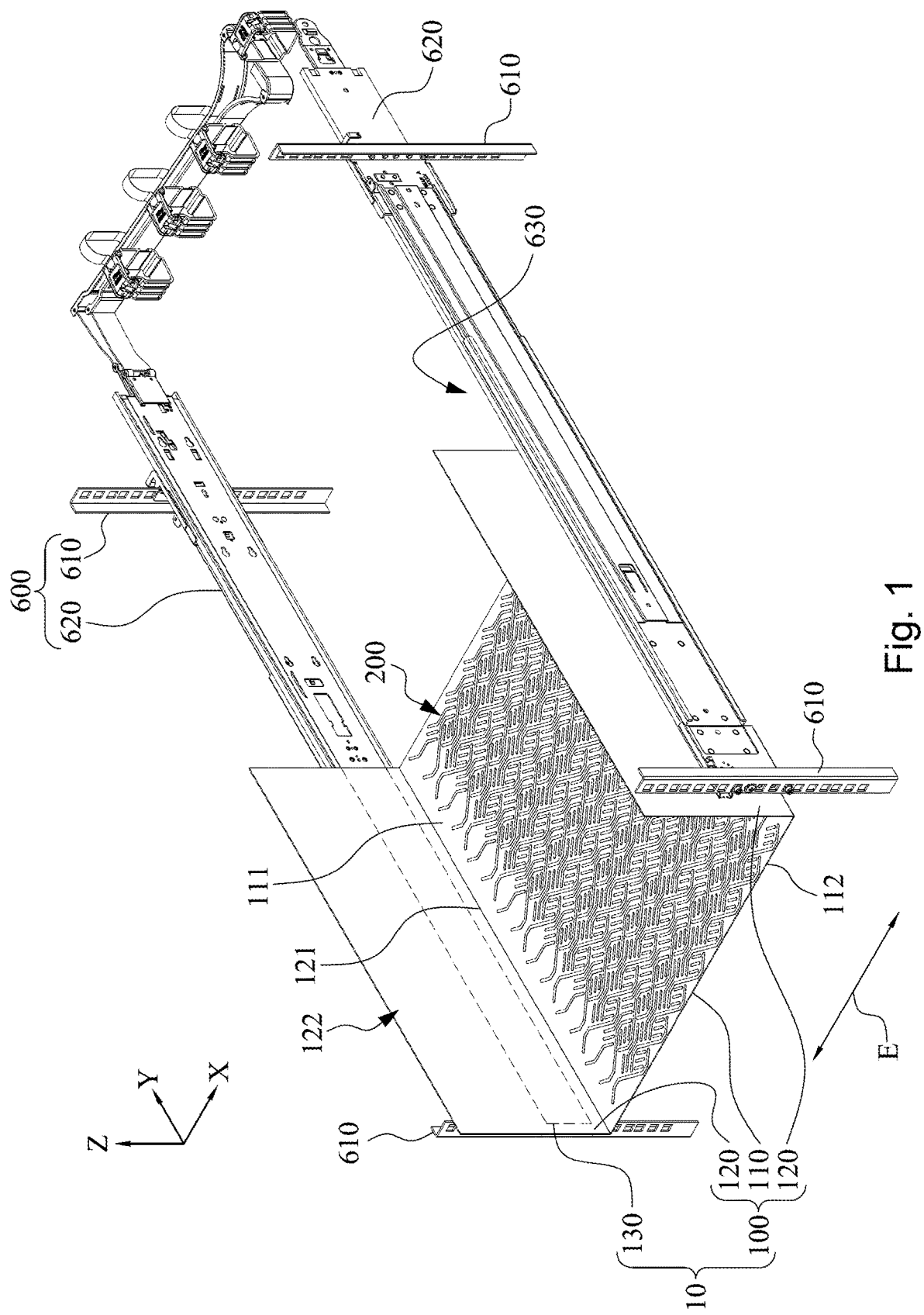
FIG. 1 is a perspective view of a server chassis placed on a rack according to an embodiment of the disclosure.

Reference will now be made in detail to the present embodiments of the disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the disclosure without departing from the scope or spirit of the disclosure.

Figure 2:
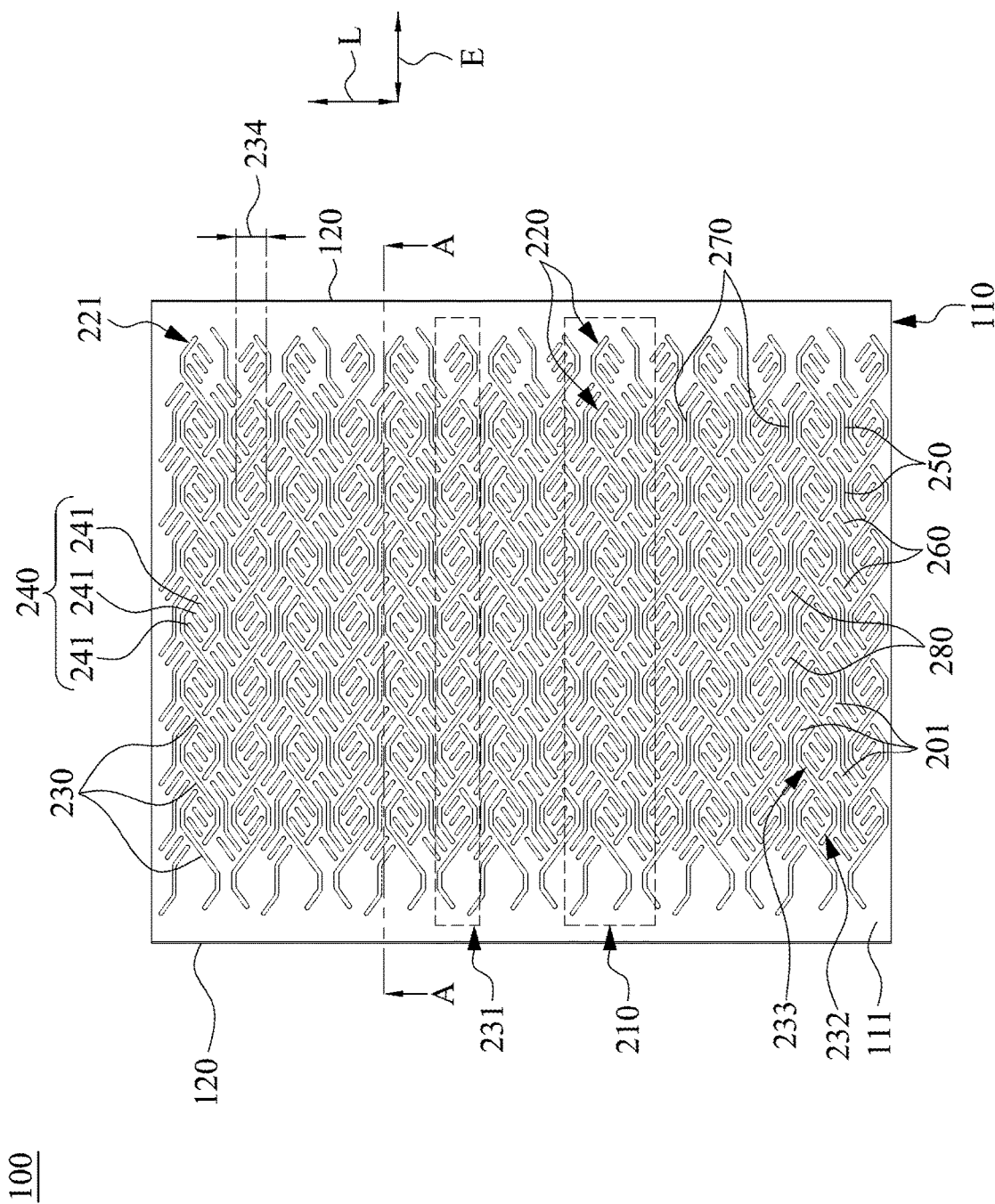
FIG. 2 is a top view of the server chassis of FIG. 1.

Reference is now made to FIG. 1 and FIG. 2, in which FIG. 1 is a perspective view of a server chassis 10 placed on a rack 600 according to an embodiment of the disclosure, and FIG. 2 is a top view of the server chassis 10 of FIG. 1. As shown in FIG. 1 and FIG. 2, in this embodiment, the server chassis 10 is removably positioned on a rack 600, and the server chassis 10 includes a housing 100 and two support portions 130. The housing 100 has a U shape and includes a bottom plate 110 and two side walls 120. The bottom plate 110 has a loading surface 111 and a backside surface 112. The loading surface 111 is, for example, rectangular, and the side walls 120 are respectively connected to two opposite sides (e.g., long side edges) of the loading surface 111 and extend together in a same direction (such as a Z axis) such that there is a bending mark 121 between each of the side walls 120 and the loading surface 111. The bottom plate 110 and the two side walls 120 together define an accommodating space 122. The housing 100 can be used as a tray for carrying various electronic components (not shown in drawings) in a server so that the electronic components are accommodated in the accommodating space 122 and placed on the loading surface 111 of the bottom plate 110 so as to support and bear the weight of the electronic components through the loading surface 111. The support portions 130 are respectively located on one surface of the side walls 120 opposite to the accommodating space 122 and configured to be erected on the rack 600, so that the bottom plate 110 is suspended on the rack 600.

The bottom plate 110 further has a three-dimensional reinforcing pattern 200. The three-dimensional reinforcing pattern 200 is evenly distributed on the loading surface 111 (such as an XY plane) of the bottom plate 110, and is processed by a pattern die to be integrally formed on the loading surface 111 of the bottom plate 110 for reinforcing the structural strength of the bottom plate 110.

Therefore, through the foregoing structure, the evenly distributed three-dimensional reinforcing pattern 200 can strengthen the structural strength of the bottom plate 110, so that the server chassis 10 bearing a weight can slow down or even avoid a degree of downward recession or bending deformation. Therefore, not only the load capacity of the server chassis 10 is reduced, but also the chance of damage to components of another lower server can be reduced, thus ensuring the smoothness of staff pulling the server.

Specifically, as shown in FIG. 1 and FIG. 2, in this embodiment, the three-dimensional reinforcing pattern 200 is disposed on all of the loading surface 111 as much as possible, that is, a coverage area of the three-dimensional reinforcing pattern 200 is substantially expected to be close to the total area of the loading surface 111 of the bottom plate 110. For example, the coverage area of the three-dimensional reinforcing pattern 200 is at least greater than 90% of the total area of the loading surface 111 of the bottom plate 110. More specifically, the coverage area of the three-dimensional reinforcing pattern 200 accounts for 80%-100% of the total area of the loading surface 111 of the bottom plate 110, or even 90%-100%. It is noted that the coverage area of the three-dimensional reinforcing pattern 200 is the entire area included by the maximum outline of the three-dimensional reinforcing pattern 200, that is, the coverage area of the three-dimensional reinforcing pattern 200 includes gaps 201 between pattern textures.

However, the disclosure is not limited thereto. In other embodiments, the three-dimensional reinforcing pattern may not need to be disposed on the whole loading surface. For example, the three-dimensional reinforcing pattern is only located on a part of the loading surface or does not cover a centroid position of the loading surface. Moreover, in other embodiments, the disclosure is not limited to the connection of the side walls to two opposite short side edges of the loading surface.

However, the disclosure is not limited to this. In other embodiments, the three-dimensional reinforcing pattern may be disposed on the entire loading surface, that is, the coverage area of the three-dimensional reinforcing pattern is equal to the total area of the loading surface of the bottom plate; alternatively, the coverage area of the three-dimensional reinforcing pattern may be only 10% of the total area of the loading surface of the bottom plate.

More specifically, as shown in FIG. 1 and FIG. 2, the three-dimensional reinforcing pattern 200 is formed by a plurality of serial texture groups 210 side by side, and the serial texture groups 210 are parallel to each other. However, the serial texture groups 210 are not necessarily parallel to each other in the disclosure. Each of the serial texture groups 210 includes a plurality of spaced-apart texture patterns 220. The texture patterns 220 are regularly and sequentially reproduced on the loading surface 111 of the bottom plate 110 toward a linear axial direction E. For example, the linear axial direction E passes through the two bending marks 121 and is parallel to a short side edge of the loading surface 111 (such as an X axis). However, the disclosure is not limited to this. In other variations, the foregoing linear axial direction may also pass through the bending marks but is not parallel to the short side edge of the loading surface.

In the foregoing three-dimensional reinforcing pattern 200, any two successively adjacent texture patterns 220 of each of the serial texture groups 210 are continuously extended in a manner of overlapping front and rear portions, that is, the front/rear portions of any two successively adjacent texture patterns 220 of each of the serial texture groups 210 are continuous side by side. Therefore, the three-dimensional reinforcing pattern 200 can reinforce the structure of the bottom plate 110 under load and increase the load-bearing capacity.

For example, in the foregoing three-dimensional reinforcing pattern 200, each of the serial texture groups 210 includes a plurality of bent portions 230 and a plurality of oblique line groups 240. Each of the bent portions 230 is respectively wavy or S-shaped, and the bent portions 230 are jointly arranged into a single-column chain-type structure 231 along the linear axial direction E such that any two successively adjacent bent portions 230 are staggered side by side. More specifically, each of the bent portions 230 has a first concave arc portion 232 and a second concave arc portion 233 opposite to each other. The first concave arc portions 232 and the second concave arc portions 233 are sequentially arranged along the linear axial direction E. In any two successively adjacent bent portions 230 in each of the single-column chain-type structures 231, the first concave arc portion 232 of one bent portion 230 and the second concave arc portion 233 of the other bent portion 230 face each other and jointly define a common area 234. Each of the oblique line groups 240 is located in one of the common areas 234. The oblique line groups 240 each include a plurality of (such as three) side-by-side linear portions 241 parallel to each other, and a long axis direction 241L of each of the linear portions 241 is not parallel to the foregoing linear axis direction E, that is, the long axis direction 241L of each of the linear portions 241 intersects with the foregoing linear axis direction E. Long axis directions 241L and 242L of the linear portions 241 in any two adjacent single-column chain-type structures 231 are different, and intersect with each other.

It is noted that in this embodiment, the bent portions 230 in the same column are staggered side by side, which means that in any two successively adjacent bent portions 230 in the same column, the first concave arc portion 232 of one bent portion 230 and the second concave arc portion 233 of the other bent portion 230 are partially continuous side by side on a same hypothetical axis L, and the hypothetical axis L and the linear axial direction E are orthogonal to each other.

In addition, in this embodiment, each of the serial texture groups 210 further includes a plurality of first bent portions 250, a plurality of first oblique line portions 260, a plurality of second bent portions 270, and a plurality of second oblique line portions 280. The first bent portions 250 and the first oblique line portions 260 are jointly located on one side of the single-column chain-type structure 231, the first bent portions 250 are sequentially arranged at intervals according to the foregoing linear axial direction E, and each of the first oblique line portions 260 is located between any two successively adjacent first bent portions 250. The second bent portions 270 and the second oblique line portions 280 are jointly located on the other side of the single-column chain-type structure 231, the second bent portions 270 are sequentially arranged at intervals according to the foregoing linear axial direction E, and each of the second oblique line portions 280 is located between any two successively adjacent second bent portions 270. In addition, the first bent portions 250 and the second bent portions 270 are disposed on both sides of the single-column chain-type structure 231 in a mutually mirrored mode. The first oblique line portions 260 and the second oblique line portions 280 are disposed on both sides of the single-column chain-type structure 231 in a mutually mirrored mode.

Figure 3A:
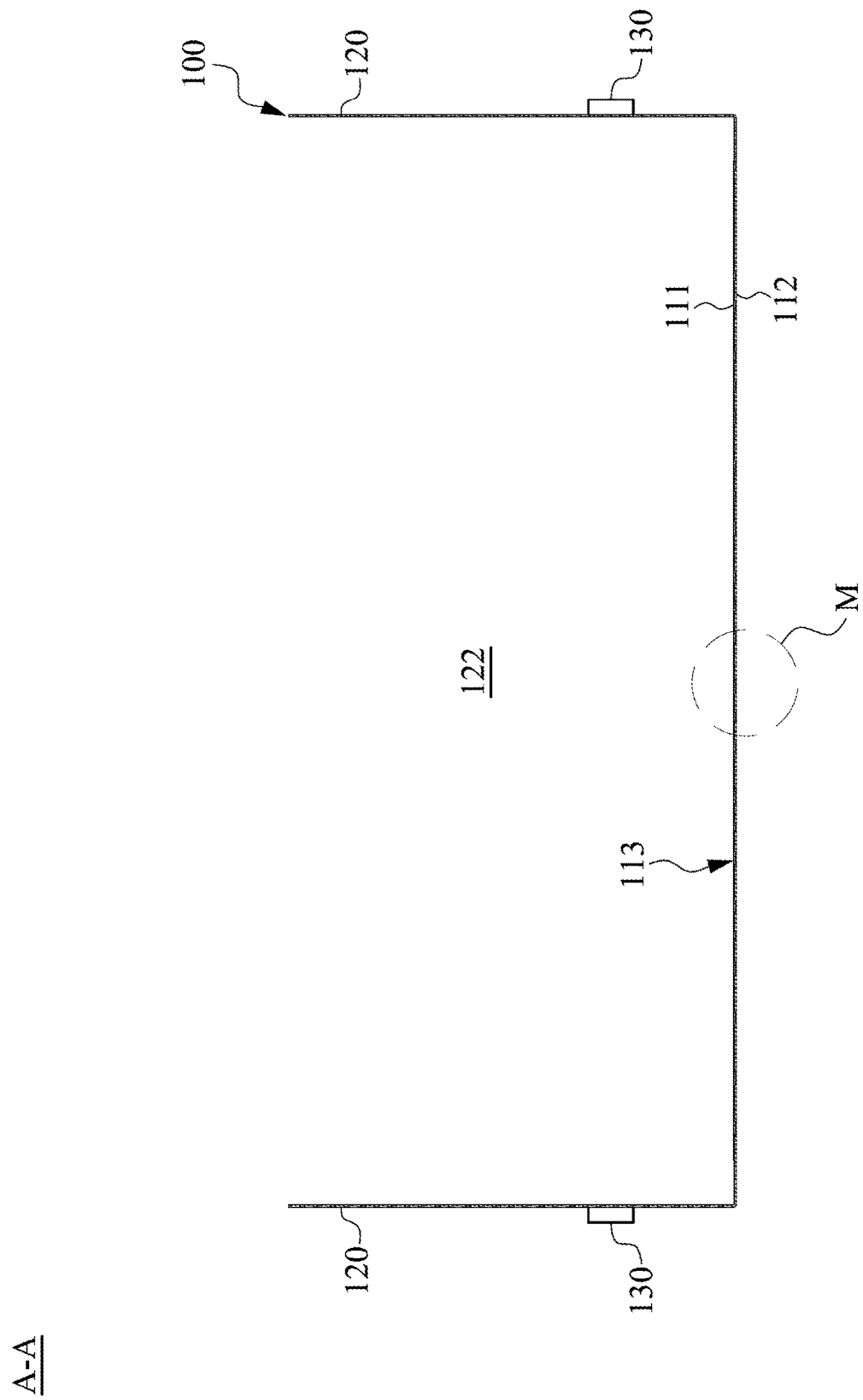
FIG. 3A is a cross-sectional view taken along a line segment AA in FIG. 2.
Figure 3B:
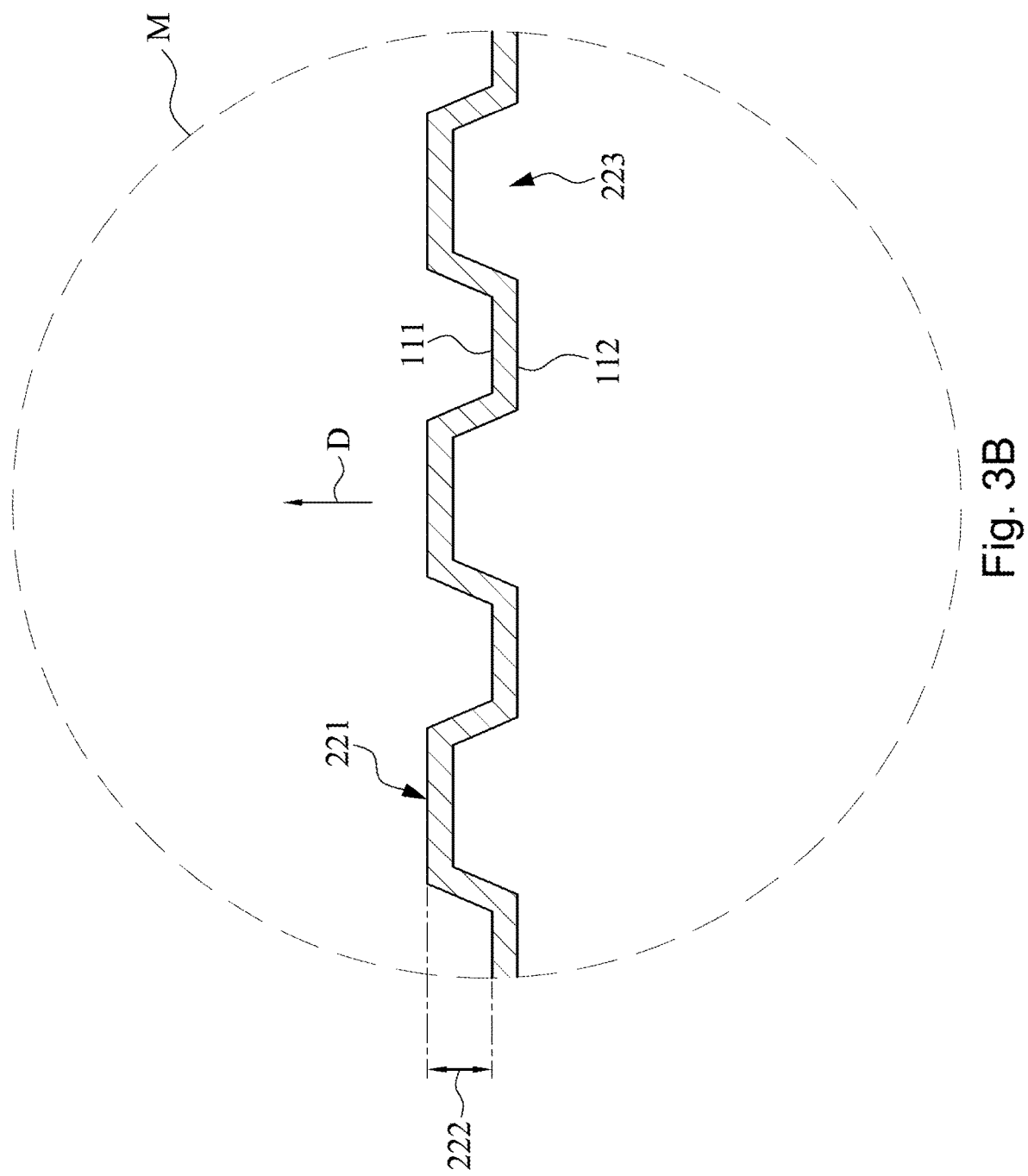
FIG. 3B is an enlarged view of a part M of FIG. 3A.

FIG. 3A is a cross-sectional view taken along a line segment AA in FIG. 2. FIG. 3B is an enlarged view of a part M of FIG. 3A. As shown in FIG. 2 and FIG. 3A, when the three-dimensional reinforcing pattern 200 is being formed, a metal sheet is processed from a backside surface 112 of the metal sheet by using a pattern die, and then the metal sheet is subsequently bent out of the foregoing housing 100. The three-dimensional reinforcing pattern 200 is an embossed pattern 221 (FIG. 3B) of the loading surface 111 of the bottom plate 110, the embossed pattern 221 bulges toward a direction D of the accommodating space 122, that is, the backside surface 112 of the bottom plate 110 has a concave pattern 223 (FIG. 3B) corresponding to the embossed pattern 221. In the disclosure, the means of processing the metal sheet through the pattern die are not limited to processing through a stamping die or an embossing roller and other similar means.

It is noted that a maximum height 222 of the embossed pattern 221 is 0.5-0.8 mm. In other words, the embossed pattern 221 is only an embossed pattern of the bottom plate 110, and is not a convex hull or a convex pillar. Therefore, due to the limited height of the embossed pattern 221, not only the hardness of the bottom plate 110 can be improved, but also the maximum space of the bottom plate 110 can be effectively utilized.

Figure 4A:
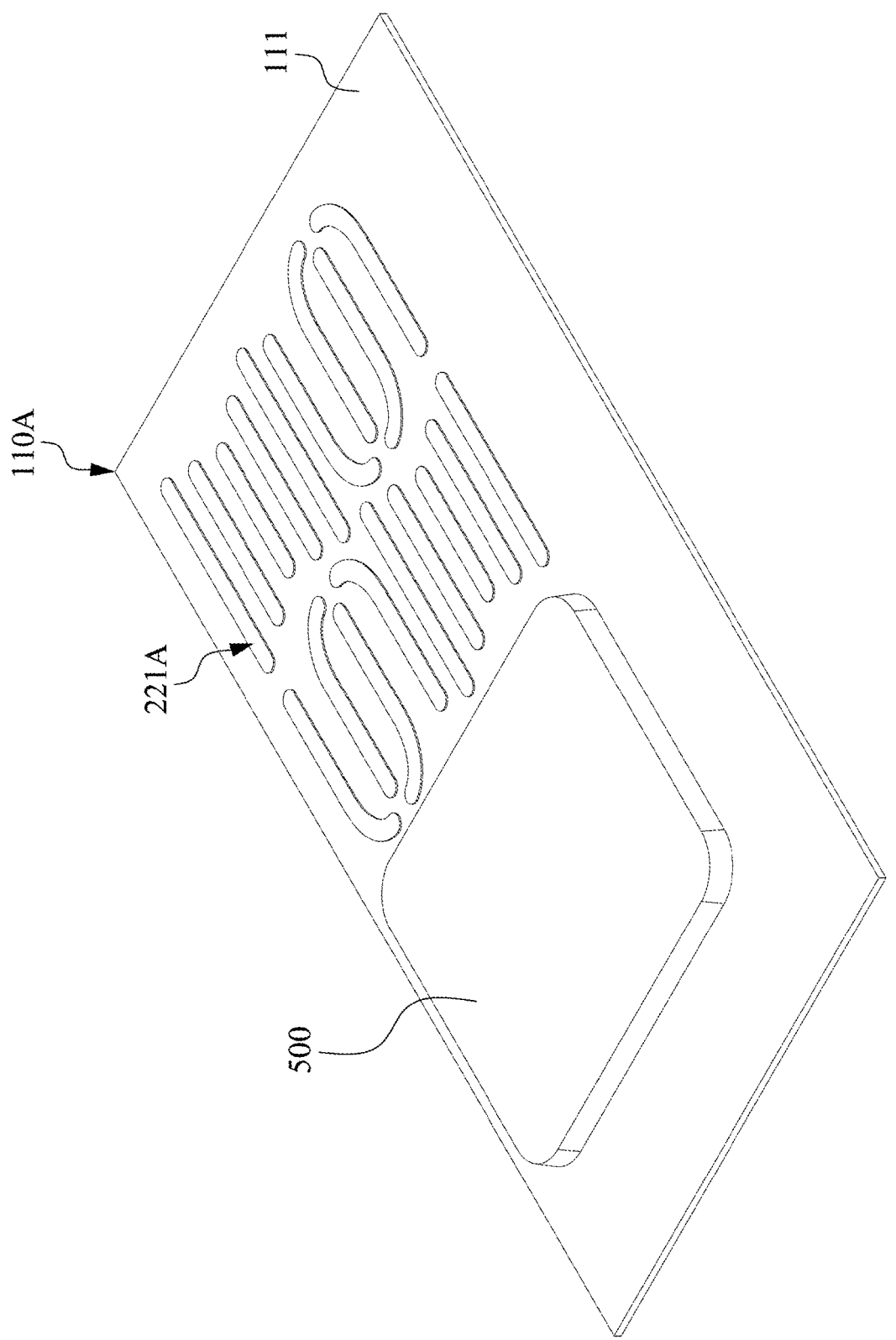
FIG. 4A is a partial schematic view of a bottom plate of a server chassis according to an embodiment of the disclosure.

FIG. 4A is a partial schematic view of a bottom plate 110A of a server chassis according to an embodiment of the disclosure. As shown in FIG. 2 and FIG. 4A, the bottom plate 110A of FIG. 4A is substantially the same as the bottom plate 110 of FIG. 2. One of the differences is that the bottom plate 110A further includes at least one reinforcing convex hull 500. The reinforcing convex hull 500 is formed on the loading surface 111 in a protruding mode. However, although an embossed pattern 221A is formed on the bottom plate 110A, the embossed pattern 221A is not formed on the reinforcing convex hull 500. Therefore, the reinforcing convex hull 500 can effectively reinforce the housing structure at a specific part.

Figure 4B:
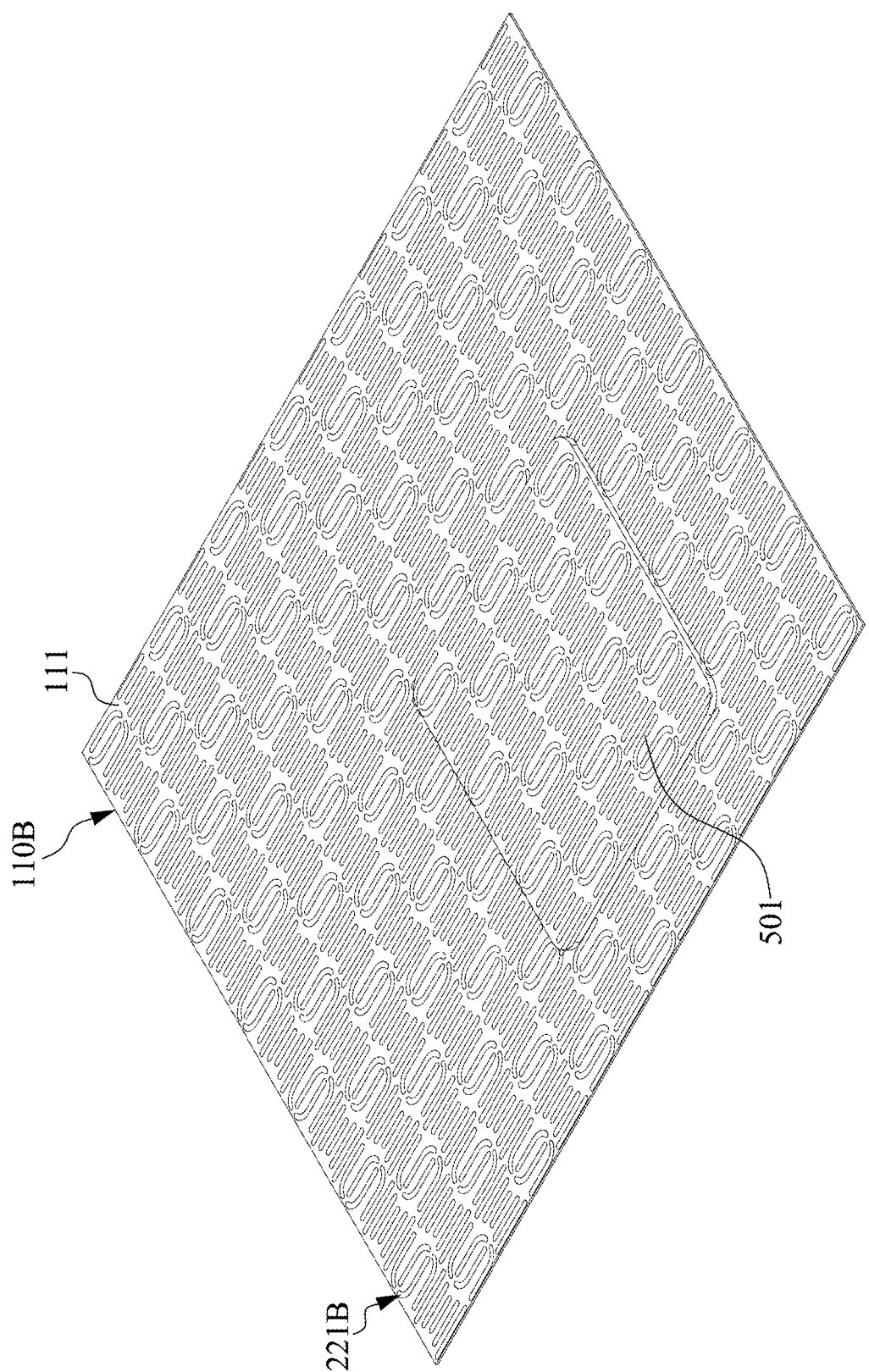
FIG. 4B is a partial schematic view of a bottom plate of a server chassis according to an embodiment of the disclosure.

FIG. 4B is a partial schematic view of a bottom plate 110B of a server chassis according to an embodiment of the disclosure. As shown in FIG. 4A and FIG. 4B, the bottom plate 110B of FIG. 4B is substantially the same as the bottom plate 110B of FIG. 4A. One of the differences is that an embossed pattern 221B is formed on the loading surface 111 of the bottom plate 110B, a reinforcing convex hull 501 of FIG. 4B is located in the coverage area of the embossed pattern 221B, and the embossed pattern 221B is located on a surface of the reinforcing convex hull 501. Therefore, in addition to the reinforcing effect of the embossed pattern 221B described above, the reinforcing convex hull 501 can more effectively provide a structural reinforcing function at a specific part.

It is noted that the foregoing embossed pattern is different from the reinforcing convex hull, and the reinforcing convex hull is much larger than the three-dimensional reinforcing pattern, and is, for example, 2 mm. However, the disclosure is not limited to this. Generally, the reinforcing convex hull 500 is formulated in accordance with industry practice standards. In addition, those with ordinary knowledge of the disclosure can determine whether to add a reinforcing convex hull to the server chassis according to requirements or restrictions in other embodiments.

Figure 5:
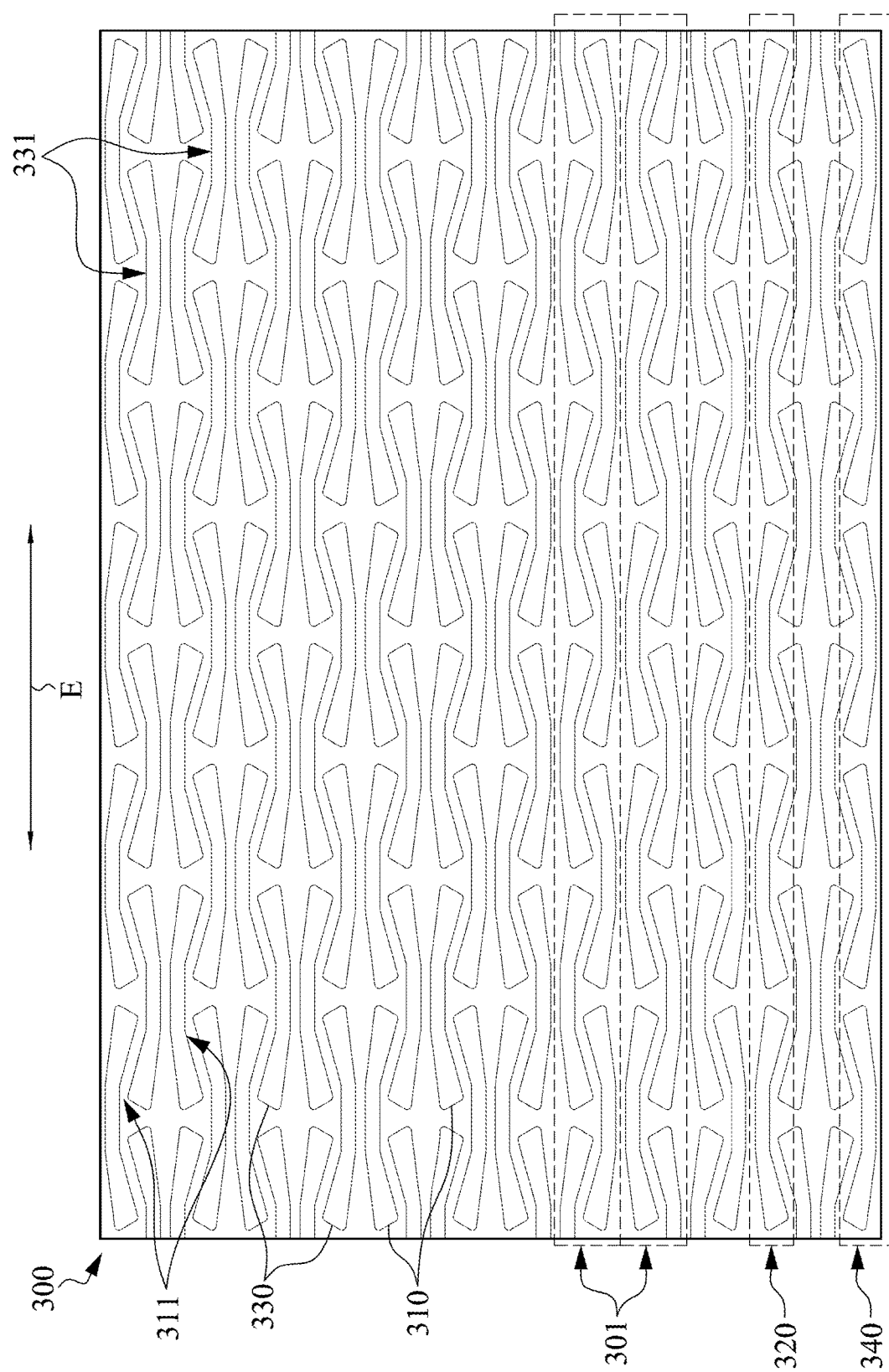
FIG. 5 is a schematic view of a three-dimensional reinforcing pattern according to an embodiment of the disclosure.

FIG. 5 is a schematic view of a three-dimensional reinforcing pattern 300 according to an embodiment of the disclosure. As shown in FIG. 5, the three-dimensional reinforcing pattern 300 in FIG. 5 is different from the three-dimensional reinforcing pattern 200 in FIG. 1. Each serial texture group 301 includes a plurality of first arc portions 310 and a plurality of second arc portions 330. The first arc portions 310 are arranged at intervals along the foregoing linear axial direction E to be a first series 320. The second arc portions 330 are arranged at intervals along the linear axial direction E to be a second series 340. The second series 340 and the first series 320 of each of the serial texture groups 301 are parallel to each other. The second arc portions 330 of the second series 340 are in staggered alignment with the first arc portions 310 of the first series 320. More specifically, each of the first arc portions 310 has a single bracket shape, and each of the first arc portions 310 has a first recess 311. Each of the second arc portions 330 has a single bracket shape, and each of the second arc portions 330 has a second recess 331. An end of each of any two successively adjacent second arc portions 330 is located in one of the first recesses 311, and an end of each of any two successively adjacent first arc portions 310 is located in one of the second recesses 331.

Figure 6:
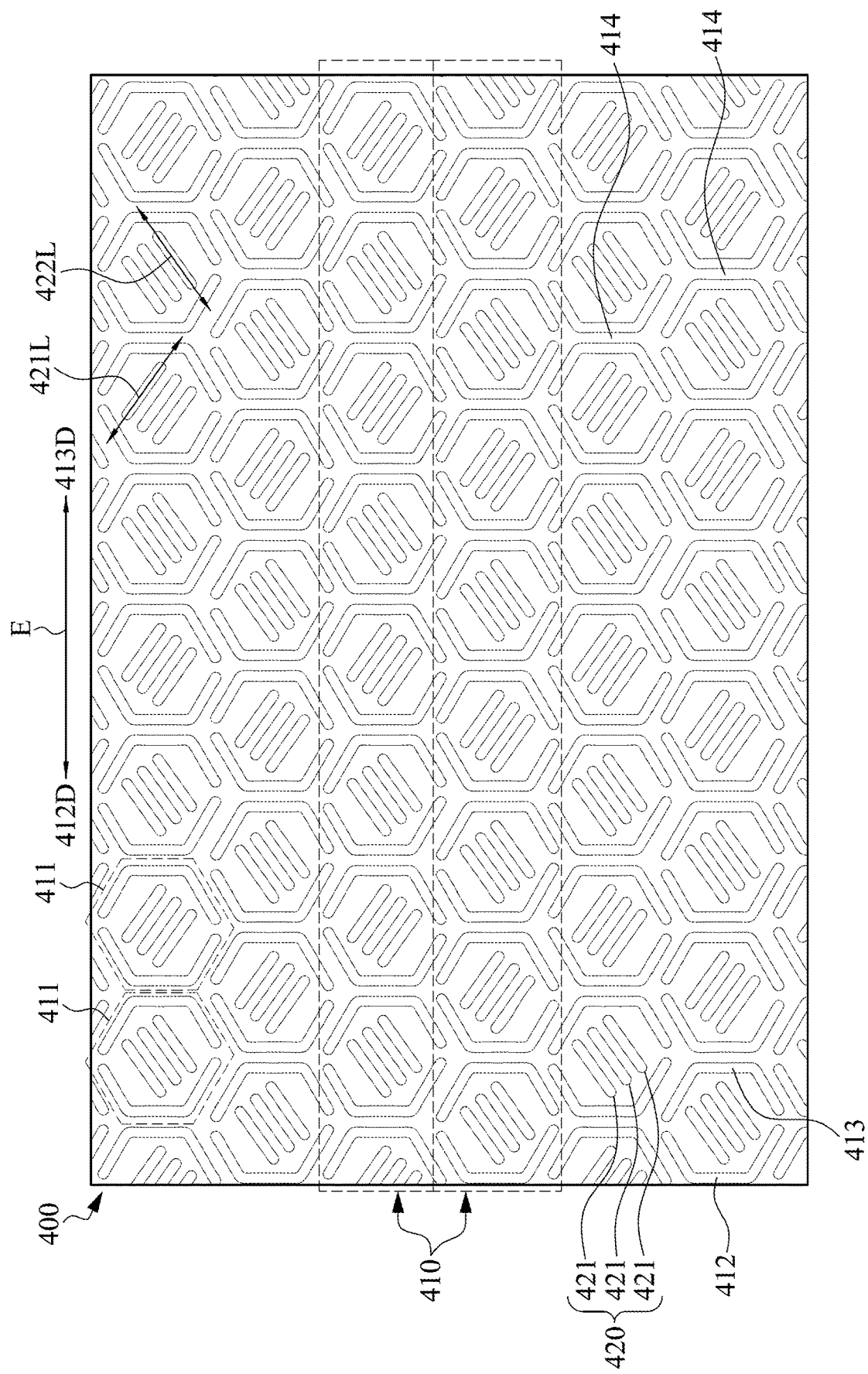
FIG. 6 is a schematic view of a three-dimensional reinforcing pattern according to an embodiment of the disclosure.

FIG. 6 is a schematic view of a three-dimensional reinforcing pattern 400 according to an embodiment of the disclosure. As shown in FIG. 2 and FIG. 6, the three-dimensional reinforcing pattern 400 in FIG. 6 is different from the three-dimensional reinforcing pattern 200 in FIG. 2. Texture patterns 411 of any two adjacent ones of the serial texture groups 410 are in staggered alignment with each other. Each of the texture patterns 411 includes a first square bracket body 412, a second square bracket body 413, and an oblique line group 420. The first square bracket body 412 has a first protruding direction 412D. The second square bracket body 413 has a second protruding direction 413D. The second protruding direction 413D and the first protruding direction 412D are opposite to each other. The oblique line group 420 is located between the first square bracket body 412 and the second square bracket body 413 and includes a plurality of side-by-side linear portions 421 parallel to each other, and a long axis direction 421L of each of the linear portions 421 is not parallel to the linear axis direction E, that is, the long axis direction 421L of each of the linear portions 421 intersects with the linear axis direction E. Long axis directions 421L and 422L of the linear portions 421 in any two adjacent oblique line groups 420 of a same column are different, and intersect with each other.

It should be understood that in this embodiment, the staggered alignment of the texture patterns 411 of adjacent serial texture groups 410 refers to that one of the texture patterns 411 of a column is aligned with a clearance 414 between two of the texture patterns 411 of another column.

Figure 7:
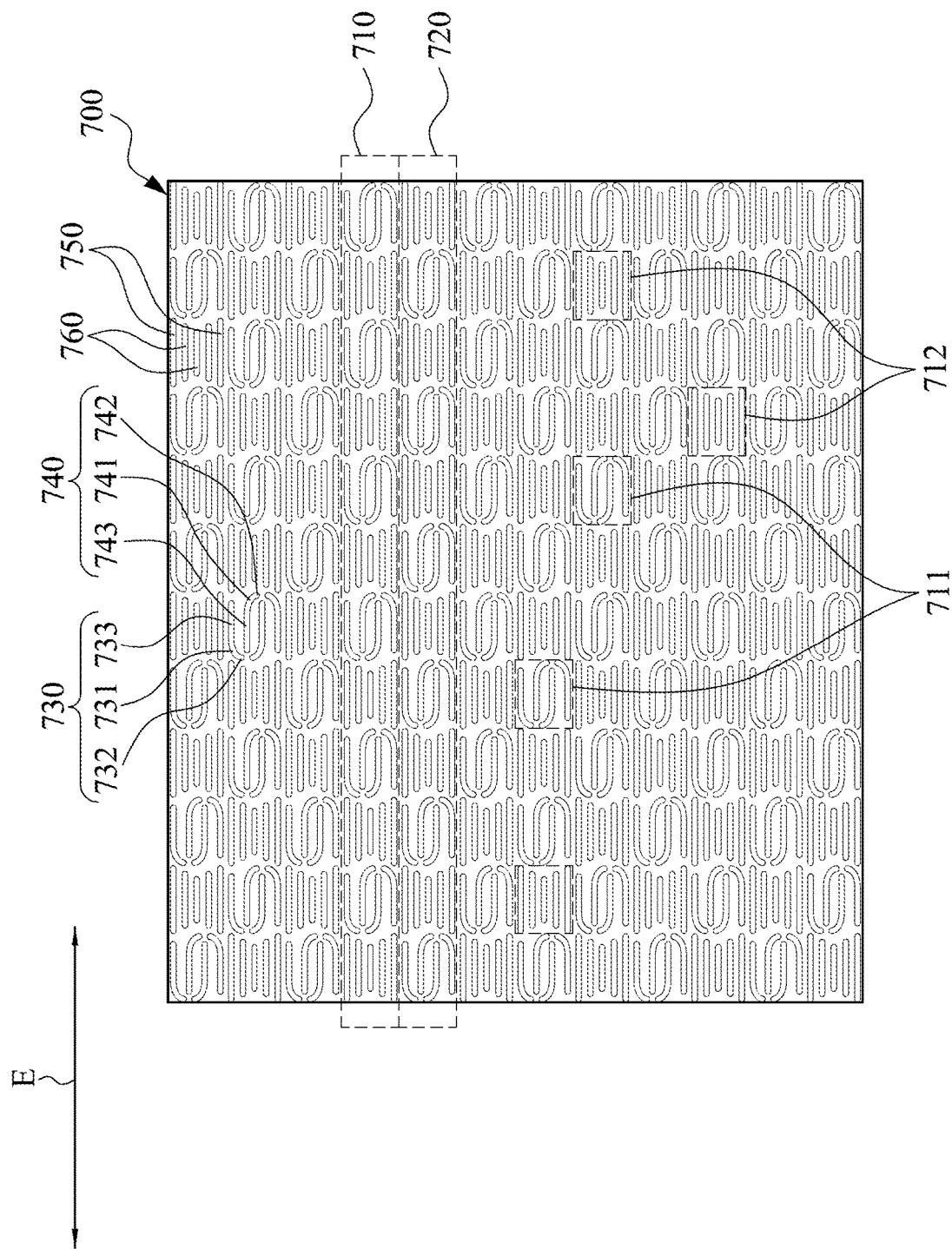
FIG. 7 is a schematic view of a three-dimensional reinforcing pattern according to an embodiment of the disclosure.

FIG. 7 is a schematic view of a three-dimensional reinforcing pattern 700 according to an embodiment of the disclosure. As shown in FIG. 2 and FIG. 7, the three-dimensional reinforcing pattern 700 in FIG. 7 is different from the three-dimensional reinforcing pattern 200 in FIG. 2. The three-dimensional reinforcing pattern 700 of FIG. 7 includes a plurality of first serial texture groups 710 and second serial texture groups 720. The first serial texture groups 710 and the second serial texture groups 720 are staggered parallel to each other. The first serial texture groups 710 each include a plurality of first texture patterns 711 and a plurality of second texture patterns 712, and the first texture patterns 711 and the second texture patterns 712 are staggered with each other. The second serial texture groups 720 each also include a plurality of first texture patterns 711 and a plurality of second texture patterns 712, and the first texture patterns 711 and the second texture patterns 712 are staggered with each other. However, the first texture patterns 711 of any two adjacent first serial texture groups 710 and the first texture patterns 711 of the second serial texture groups 720 are staggered side by side, and the second texture patterns 712 of the adjacent first serial texture groups 710 and the second texture patterns 712 of the second serial texture groups 720 are staggered side by side.

More specifically, each of the first texture patterns 711 includes two first hook-shaped ribs 730 and two second hook-shaped ribs 740. Each of the first hook-shaped ribs 730 includes a first hook portion 731 and a first straight line portion 733. One end of the first hook portion 731 is directly connected to the first straight line portion 733, and the other end is a first free end 732. The first free ends 732 of the first hook-shaped ribs 730 face each other, the first straight line portions 733 of the first hook-shaped ribs 730 are parallel to each other side by side, and a length direction of each of the first straight line portions 733 is parallel to the linear axial direction E. Each of the second hook-shaped ribs 740 includes a second hook portion 741 and a second straight line portion 743. One end of the second hook portion 741 is directly connected to the second straight line portion 743, and the other end is a second free end 742. The second free ends 742 of the second hook-shaped ribs 740 face each other, the second straight line portions 743 of the second hook-shaped ribs 740 are parallel to each other side by side, and a length direction of each of the second straight line portions 743 is parallel to the linear axial direction E. The first free end 732 of each of the first hook-shaped ribs 730 and the second free end 742 of each of the second hook-shaped ribs 740 are disposed opposite to each other, one of the first hook-shaped ribs 730 is positioned between the two second straight line portions 743, and one of the second hook-shaped ribs 740 is positioned between the two first straight line portions 733.

Each of the second texture patterns 712 includes two first straight ribs 750 and a plurality of second straight ribs 760, the first straight ribs 750 are parallel to each other side by side, and a length direction of each of the first straight ribs 750 is parallel to the linear axial direction E. The second straight ribs 760 are jointly located between the first straight ribs 750, a length of each of the second straight ribs 760 is smaller than that of each of the first straight ribs 750, and a length direction of each of the second straight ribs 760 is parallel to the linear axial direction.

Figure 8:
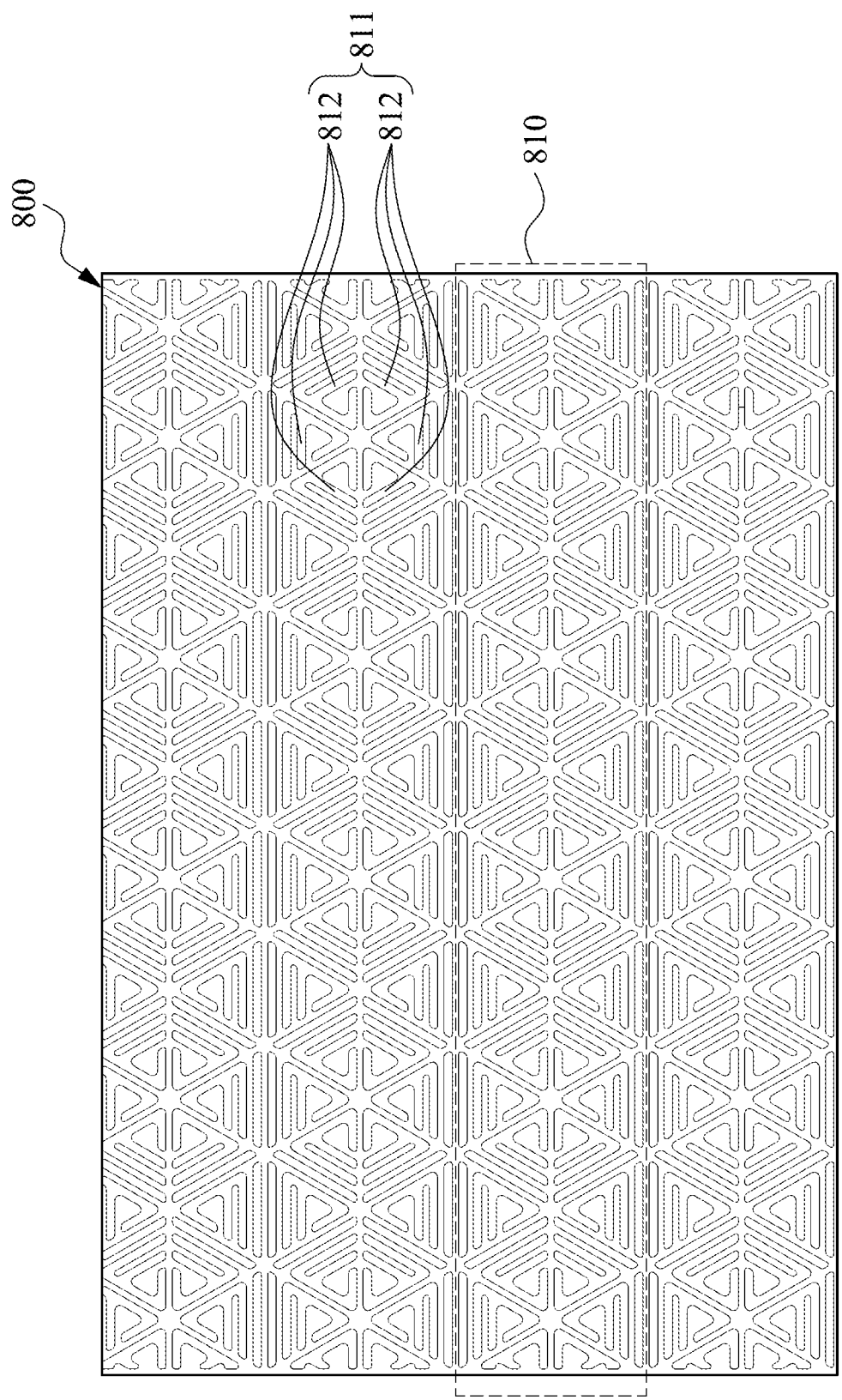
FIG. 8 is a schematic view of a three-dimensional reinforcing pattern according to an embodiment of the disclosure.

FIG. 8 is a schematic view of a three-dimensional reinforcing pattern according to an embodiment of the disclosure. As shown in FIG. 2 and FIG. 8, a three-dimensional reinforcing pattern 800 in FIG. 8 is different from the three-dimensional reinforcing pattern 200 in FIG. 2. The three-dimensional reinforcing pattern 800 of FIG. 8 includes a plurality of serial texture groups 810. Each of the serial texture groups 810 includes a plurality of hexagonal-like patterns 811, and each of the hexagonal-like patterns includes six triangular-like patterns 812.

In addition, as shown in FIG. 1, the rack 600 includes four outer column members 610 and two brackets 620. The outer column members 610 are vertically spaced apart to collectively define an internal space 630. The brackets 620 are symmetrically located in the internal space 630, and each of the brackets 620 is fixedly connected to two of the outer column members 610. One of the support portions 130 is supported by each of the brackets 620, and the support portions 130 are each, for example, a sliding rail. The server chassis 10 is slidably positioned on the bracket 620 to enter and exit the internal space 630. However, the disclosure is not limited to this, and the support portion 130 may be a convex rib or folded edge integrally formed with the housing 100.

Although the disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:
1. A server chassis, comprising:
 a housing, comprising:
  a bottom plate having a loading surface and a three-dimensional reinforcing pattern, wherein the three-dimensional reinforcing pattern is processed by a pattern die to be integrally formed on the loading surface for reinforcing the structural strength of the bottom plate; and
  two side walls respectively connected to two opposite sides of the loading surface and extending together in a same direction, wherein a bending mark is respectively disposed between each of the side walls and the loading surface, and the loading surface and the side walls together define an accommodating space; and two support portions respectively located on one side of each of the side walls opposite to the accommodating space and configured to be erected on a rack, wherein the three-dimensional reinforcing pattern is formed by arranging a plurality of chain-type serial texture groups side by side, each of the serial texture groups comprises a plurality of spaced-apart texture patterns, the texture patterns are regularly reproduced on the loading surface toward a linear axial direction, portions of any two successively adjacent texture patterns of each of the serial texture groups are continuous by side, and a maximum height of each of the texture patterns is 0.5-0.8 mm, each of the serial texture groups comprises a plurality of bent portions, wherein the plurality of bent portions are respectively wavy, and are jointly arranged into a single-column chain-type structure along the linear axial direction; any two successively adjacent bent portions are staggered side by side; each of the bent portions has a first concave arc portion and a second concave arc portion opposite to each other, and the first concave arc portion and the second concave arc portion of any two successively adjacent bent portions of the single-column chain-type structure face each other and jointly define a common area; and a plurality of oblique line groups respectively located in one of the common areas, wherein each of the oblique line groups comprises a plurality of side-by-side linear portions parallel to each other, and a long axis direction of each of the linear portions intersects with the linear axis direction.

2. The server chassis of claim 1, wherein the three-dimensional reinforcing pattern is an embossed pattern on the loading surface, and a surface of the bottom plate facing away from the loading surface has a concave pattern.

3. The server chassis of claim 2, further comprising:
at least one reinforcing convex hull formed on the loading surface in a protruding mode, wherein the reinforcing convex hull is located in the coverage area of the embossed pattern, and the embossed pattern is located on a surface of the reinforcing convex hull.

4. The server chassis of claim 1, wherein the linear axial direction passes through the bending marks.

5. The server chassis of claim 4, wherein the linear axial direction passing through the bending marks is parallel to a side edge of the loading surface.

6. The server chassis of claim 1, wherein a coverage area of the three-dimensional reinforcing pattern is greater than 10% of the total area of the loading surface.

7. The server chassis of claim 1, wherein a coverage area of the three-dimensional reinforcing pattern accounts for 90%-100% of the total area of the loading surface.

8. A server chassis, comprising:
a housing, comprising:
a bottom plate having a loading surface and a three-dimensional reinforcing pattern, wherein the three-dimensional reinforcing pattern is processed by a pattern die to be integrally formed on the loading surface for reinforcing the structural strength of the bottom plate; and
two side walls respectively connected to two opposite sides of the loading surface and extending together in a same direction, wherein a bending mark is respectively disposed between each of the side walls and the loading surface, and the loading surface and the side walls together define an accommodating space; and two support portions respectively located on one side of each of the side walls opposite to the accommodating space and configured to be erected on a rack,
wherein the three-dimensional reinforcing pattern is formed by arranging a plurality of chain-type serial texture groups side by side, each of the serial texture groups comprises a plurality of spaced-apart texture patterns, the texture patterns are regularly reproduced on the loading surface toward a linear axial direction, portions of any two successively adjacent texture patterns of each of the serial texture groups are continuous by side, and a maximum height of each of the texture patterns is 0.5-0.8 mm, the texture patterns of any two adjacent ones of the serial texture groups are in staggered alignment with each other, and each of the texture patterns comprises a first square bracket body, a second square bracket body, and an oblique line group; the first square bracket body has a first protruding direction parallel to the linear axial direction; the second square bracket body has a second protruding direction parallel to the linear axial direction; the second protruding direction and the first protruding direction are opposite to each other; the oblique line group is located between the first square bracket body and the second square bracket body and comprises a plurality of parallel side-by-side linear portions, and a long axis direction of each of the linear portions intersects with the linear axis direction.

9. The server chassis of claim 8, wherein the three-dimensional reinforcing pattern is an embossed pattern on the loading surface, and a surface of the bottom plate facing away from the loading surface has a concave pattern.

10. The server chassis of claim 9, further comprising:
at least one reinforcing convex hull formed on the loading surface in a protruding mode, wherein the reinforcing convex hull is located in the coverage area of the embossed pattern, and the embossed pattern is located on a surface of the reinforcing convex hull.

11. The server chassis of claim 8, wherein the linear axial direction passes through the bending marks.

12. The server chassis of claim 11, wherein the linear axial direction passing through the bending marks is parallel to a side edge of the loading surface.

13. The server chassis of claim 8, wherein a coverage area of the three-dimensional reinforcing pattern is greater than 10% of the total area of the loading surface.

14. The server chassis of claim 8, wherein a coverage area of the three-dimensional reinforcing pattern accounts for 90%-100% of the total area of the loading surface.

15. A server chassis, comprising:
a housing, comprising:
a bottom plate having a loading surface and a three-dimensional reinforcing pattern, wherein the three-dimensional reinforcing pattern is processed by a pattern die to be integrally formed on the loading surface for reinforcing the structural strength of the bottom plate; and
two side walls respectively connected to two opposite sides of the loading surface and extending together in a same direction, wherein a bending mark is respectively disposed between each of the side walls and the loading surface, and the loading surface and the side walls together define an accommodating space; and two support portions respectively located on one side of each of the side walls opposite to the accommodating space and configured to be erected on a rack, wherein the three-dimensional reinforcing pattern is formed by arranging a plurality of chain-type serial texture groups side by side, each of the serial texture groups comprises a plurality of spaced-apart texture patterns, the texture patterns are regularly reproduced on the loading surface toward a linear axial direction, portions of any two successively adjacent texture patterns of each of the serial texture groups are continuous by side, and a maximum height of each of the texture patterns is 0.5-0.8 mm, wherein texture patterns of each of the serial texture groups comprises a plurality of first texture patterns and a plurality of second texture patterns, the first texture patterns and the second texture patterns are staggered with each other, and the first texture patterns of any two adjacent ones of the serial texture groups are staggered side by side and the second texture patterns are staggered side by side, each of the first texture patterns comprises two first hook-shaped ribs and two second hook-shaped ribs; each of the first hook-shaped ribs comprises a first hook portion and a first straight line portion; one end of the first hook portion is directly connected to the first straight line portion, and the other end is a first free end; the first free ends of the first hook-shaped ribs face each other, the first straight line portions of the first hook-shaped ribs are parallel to each other side by side, and a length direction of each of the first straight line portions is parallel to the linear axial direction; each of the second hook-shaped ribs comprises a second hook portion and a second straight line portion; one end of the second hook portion is directly connected to the second straight line portion, and the other end is a second free end; the second free ends of the second hook-shaped ribs face each other, the second straight line portions of the second hook-shaped ribs are parallel to each other side by side, and a length direction of each of the second straight line portions is parallel to the linear axial direction; the first free end of each of the first hook-shaped ribs and the second free end of each of the second hook-shaped ribs are disposed opposite to each other, one of the two first hook-shaped ribs is positioned between the two second straight line portions, and the other of the two second hook-shaped ribs is positioned between the two first straight line portions, and each of the second texture patterns comprises a plurality of first straight ribs and at least one second straight rib, the first straight ribs are parallel to each other side by side, and a length direction of each of the first straight ribs is parallel to the linear axial direction; the second straight rib is located between the first straight ribs, a length of the second straight rib is smaller than that of each of the first straight ribs, and a length direction of each of the second straight ribs is parallel to the linear axial direction.

16. The server chassis of claim 15, wherein the three-dimensional reinforcing pattern is an embossed pattern on the loading surface, and a surface of the bottom plate facing away from the loading surface has a concave pattern.

17. The server chassis of claim 16, further comprising:
at least one reinforcing convex hull formed on the loading surface in a protruding mode, wherein the reinforcing convex hull is located in the coverage area of the embossed pattern, and the embossed pattern is located on a surface of the reinforcing convex hull.

18. The server chassis of claim 15, wherein the linear axial direction passes through the bending marks.

19. The server chassis of claim 18, wherein the linear axial direction passing through the bending marks is parallel to a side edge of the loading surface.

20. The server chassis of claim 15, wherein a coverage area of the three-dimensional reinforcing pattern is greater than 10% of the total area of the loading surface.

21. The server chassis of claim 15, wherein a coverage area of the three-dimensional reinforcing pattern accounts for 90%-100% of the total area of the loading surface.

* * * * *